United States Patent [19]

Walsh et al.

[11] Patent Number: 4,950,553

[45] Date of Patent: * Aug. 21, 1990

[54] THERMALLY STABLE DUAL METAL COATED LAMINATE PRODUCTS MADE FROM POLYIMIDE FILM

[75] Inventors: Daniel P. Walsh, Peabody, Mass.; Philip D. Knudsen, South Berwick, Me.

[73] Assignee: Polyonics Corporation, Newburyport, Mass.

[*] Notice: The portion of the term of this patent subsequent to Feb. 16, 2005 has been disclaimed.

[21] Appl. No.: 300,044

[22] Filed: Jan. 23, 1989

Related U.S. Application Data

[63] Continuation-in-part of Ser. No. 155,897, Feb. 16, 1988, Pat. No. 4,868,071, which is a continuation-in-part of Ser. No. 18,346, Feb. 24, 1987, Pat. No. 4,725,504, and a continuation-in-part of Ser. No. 18,342, Feb. 24, 1987, Pat. No. 4,806,395.

[51] Int. Cl.$^5$ ............................................. B32B 15/08
[52] U.S. Cl. .................................. 428/626; 428/675; 428/680
[58] Field of Search ................ 428/621, 626, 675, 680

[56] References Cited

U.S. PATENT DOCUMENTS

| | | | |
|---|---|---|---|
| 3,691,007 | 9/1972 | Paulon | 428/626 |
| 4,019,877 | 4/1977 | Gass et al. | 428/675 |
| 4,394,419 | 7/1983 | Konicek | 428/675 |
| 4,503,112 | 3/1985 | Konicek | 428/675 |
| 4,725,504 | 2/1988 | Knudsen | 428/675 |

Primary Examiner—L. Dewayne Rutledge
Assistant Examiner—George Wyszomierski
Attorney, Agent, or Firm—Paul J. Cook

[57] ABSTRACT

Bath surfaces of a polyimide sheet are coated with a layer of electroless nickel or cobalt which can also include a thin electroless copper layer on the Ni. or Co. This tenaciously bonded coating is subsequently treated in such a way so as to increase its permeability or porosity without substantially altering its resistive properties. The induced porosity allows water and other volatiles trapped in the dielectric polyimide sheet to be removed while the preserved electrical continuity of the metal layer is sufficient to support electrolytic copper plating which services the dual purpose of providing a copper thickness useful for the subsequent production of electronic circuitry and preventing the readsorption of water into the dielectric core by permanently sealing or coating said porous metal layer.

5 Claims, 2 Drawing Sheets

THERMALLY STABLE DUAL METAL COATED LAMINATE PRODUCTS MADE FROM POLYIMIDE FILM

REFERENCE TO RELATED APPLICATION

This application is a continuation-in-part of copending application Ser. No. 155,897, filed Feb. 16, 1988, now U.S. Pat. No. 4,868,071 which in turn is a continuation-in-part of application Ser. No. 018,346, filed Feb. 24, 1987, now U.S. Pat. No. 4,725,504 and U.S. Ser. No. 018,342, filed Feb. 24, 1987, now U.S. Pat. No. 4,806,395.

This invention relates to a process for coating one or both surfaces of a polyimide sheet with electrolessly deposited nickel or cobalt and electrolytically deposited copper, and to the thermally stable laminate product obtained by the process.

Certain electronic assemblies have conductor traces on both sides of a dielectric substrate. Preferred dielectrics for applications requiring flexible substrates, especially in multilayer constructions, involve the use of polyimide films. In general practice the conductive layers on this substrate are provided through the use of metal foils and adhesives specially formulated for their physical and thermal stability. The conductive layers are also provided in some cases through direct metalization by sputtering or by electroless deposition involving methods well known to those versed in the art.

Currently there are no commercially available polyimide laminate materials produced in the absence of an adhesive, suitable for IPC Class 3 electronic circuit applications. The adhesive bonding method has certain disadvantages especially in critical service and multilayer applications, where either properties of the adhesive or the physical space occupied by the adhesive are limiting factors. For example, these adhesive-bonded laminate materials exhibit poor dimensional stability, a severe disadvantage for laying up multilayer boards. The preferred construction (especially in multilayer applications) would avoid the use of adhesives and provide the metal directly bonded to the substrate. Until the present invention, however, the methods available for direct metalization of polyimide film substrates had more significant drawbacks that the adhesive bonding methods.

Two methods for preparing polyimide adhesiveless metal coated laminates are the related methods of vacuum and sputter deposition, followed by electrolytic copper buildup to desired thicknesses. Sputtering provides better adhesion than vapor deposition but neither technique provides physical properties adequate for critical service applications. Several commercially available single-sided materials are produced by these methods. The adhesion values obtained on subsequent copper buildup to greater than 25 um are very low for materials with sputtered copper. One structure has an initial chromium layer sputtered to the polyimide film which is then covered with a sputtered layer of copper is described in U.S. patent application Ser. No. 775,918. A disadvantage of this construction is that chromium is not removed easily during subtractive processing of electronic traces using standard etchants designed to remove copper.

An alternative method for preparing a polyimide adhesiveless metal clad laminate is to cast a liquid solution of a polyimic acid onto the surface of a metal foil, and to heat the entire composition to a temperature which will imidize the polyamic acid and form a polyimide or amide modified polyimide film. Several modifications of this basic technique are disclosed in U.S. Pat. Nos. 3,682,960; 3,781,596; 3,981,691; 4,148,969; and 4,496,794. At present, laminates produced by this technique have limited application areas due to their poor dimensional stability. This method is also limited by the availability of suitable foil thicknesses.

Prior to this invention, it was believed necessary to provide an adherent metal layer or layers to a polyimide film substrate by chemical metal deposition, several basic procedures are employed. Since processing is done in aqueous solutions, it was believed necessary to uniformly and completely texture the surface of the polyimide film to facilitate uniform adsorption of the catalyst used for seeding the electroless metal deposition s disclosed in U.S. Ser. No. 155,897, filed Feb. 16, 1988. Commonly referred to as etching, it was believed that this treatment also served to microetch the surface of the polyimide, thus providing a mechanical interlock between the polyimide and metal layer. This surface preparative step will be referred to herein as texturing for purposes of this application to avoid confusion with the removal of unwanted metal during circuit preparation which also is referred to as etching in the printed circuit industry.

U.S. Pat. No. 3,767,538 to Politycki et al describes an attempt to produce a well-adherent double-sided laminate on polyimide film. The film surface is roughened by a fresh mixture of sulfuric and hydrochloric acids or by mechanical impingement of sand on the surface and, if needed, a further sodium hydroxide treatment may be employed. The polyimide film is then heated to expel water and then seeded for metalization in a colloidal palladium bath. After this, an electrically conductive, water-vapor permeable continuous layer of silver is deposited by electroless deposition and the film is heated at 150° C. to expel water. Finally, a layer of copper is electrolytically deposited to form the laminate structure. No specific adhesion values are reported for the laminate produce by this method.

A high speed additive circuit process on a polyimide substrate using electroless nickel for metalization (no etching of metal required) is described in U.S. Pat. No. 3,573,973 to Drotar et al. The basic process steps are: preparing the substrate, catalyzing, printing a mask, heat setting of the masking ink, electroless plating of a nickel/phosphorous alloy, heating at 195° C. to improve metal to polyimide bond and then either electrolytic plating or solder coating to decrease the electrical resistance of the resultant structure. The use of a nickel/phosphorous alloy as the metalizing layer may cause difficulty etching laminates produced by this method during subtractive circuit production methods. Another disadvantage of this process is at a very high temperature (195° C.) in order to provide the desired adhesion characteristics. The adhesion values reported are 5.0 lb./in. maximum by a nonstandard test and there is no mention of the stability of the product to solder float or thermal cycling stress. The low adhesion of metal to polyimide limits the use of these laminates to specialty applications. The method of Drotar, therefore, does not provide a method for preparation of metal coated laminates for general use in the printed circuit industry.

In U.S. Pat. No. 3,954,570 to Shirk et al, another additive method is disclosed wherein the electroless deposit may be nickel. The authors cite no advantage of one metal over another in the initial metalizing step, and specifically claim a patterned flame sensitized surface which is catalyzed, preferably with tin and palladium, then electroless plated with either copper, nickel or cobalt. The method of Shirk also provides low bond strengths, and for the nonstandard solder dip test disclosed, no advantage is stated for the use of electroless nickel rather than electroless copper or cobalt.

Another additive method for circuit preparation on a polyimide substrate is disclosed in U.S. Pat. No. 4,078,096 to Redmond et al. The method described is for texturing the surface of the polymer with a hydrazine/caustic solution, catalyzing, then plating with either electroless nickel, copper or cobalt. The method relates to the preparation of a specific circuit type by an additive process, and the maximum initial peel strength disclosed is only 4.6 lb/in. which is too low for general use in the printed circuit industry. Samples made by the method of this patent result in cohesive failure of the polyimide film at bond values of only 4.0 lb./in. using the optimum formulation of 60 percent hydrazine hydrate and 9.3 percent sodium hydroxide disclosed by Redmond et al. This lowering of the cohesive strength of the film is alluded to by Redmond in Column 4, lines 37–40, where the failure mode of well adhered and poorly adhered samples is discussed. Cohesive failure at such low values indicated degradation of the polymer film which is seen as ripping in the Z-axis during peel testing. There is no disclosure of completely coating one or both surfaces of a polyimide sheet with electrolessly deposited metal followed by electrolytically deposited metal.

There have been prior attempts to provide an adherent metal layer on both sides of polyimide sheets by direct metalization using electroless copper followed by electrolytic copper buildup to the desired thickness. This technique has proven unsuitable in practice since blistering of the electroless copper layer usually occurs when simultaneously applied to both sides of the film. If blistering is avoided, the peel strength of the resultant laminate is less than that for a single-sided laminate of the same metal thickness.

Perins, in *Transactions of the Institute of Metal Finishing* (1972) Volume 50, pp. 38–45, discloses a process for electroplating propylene polymers with electroless nickel or copper followed by electrolytic plating with copper. The plating in this case is conducted on only one side of propylene copolymer plaques. The use of the nickel provides improved adhesion especially after thermal cycling of the sample which will cause degradation of the copper/polymer bond. This process, where nickel is used as the base metal layer, has only been applied to injection molded or bulk processed polymers, but has not been extended for use on thin film substrates. Therefore, the nickel process has been restricted to use where the nickel layer is never removed but remains a permanent part of the finished article.

In "Applications of Additive Circuitry", a technical paper presented at the Institute of Printed Circuits in September, 1974, Brewer discloses a method in which nickel is deposited on both surfaces of a paper reinforced phenolic. Electroless copper is then deposited and the plated panel is heated beyond the glass transition temperature of the substrate material to improve the nickel to polymer adhesion. This method is not applicable to non-thermoplastic substrates such as polyimide films.

*In Plating and Surface Finishing*, "Interfacial Bonding of Nickel to Polyamide-Imide", Vol. 66, No. 6, (June, 1979) pp. 68–71, Levey et. al, describes nickel plating on a rigid polyamide-imide substrate textured with an abrasive and/or sodium or potassium hydroxide. The article relates the effect of various surface treatments on metal adhesion, and specifically to the combination of mechanical abrasion followed by a chemical treatment such as dipping in aqueous alkali metal hydroxide solutions. The article states that no advantage was observed with the use of nickel rather than copper for the initial metalization of the polymer, and concludes that the adhesion of the metal to the polyamide-imide substrate is a combination of both mechanical and chemical factors related to the substrate.

Prior to the present invention, there has been no commercially viable method available for the direct coating of polyimide films with electrically conductive layers, without the use of an adhesive exhibiting adequate properties for general use in electronic circuitry other than as disclosed in U.S. Ser. No. 155,897 referred to above. Adhesiveless laminates with metal on both sides have not been available due to the tendency for an electroless metal layer to blister during deposition onto both sides of a thin film, and to the destruction of polyimide to metal adhesion by thermal shock upon immersion in molten solder or because of undesirable reduction of film strength due to texturing. The problem of electroless metal blistering is especially acute in the complete metalization of thin polymeric film; hydrogen evolution during the deposition process has been suggested as a cause of electroless metal blistering. Electroless metal blistering on thin polymeric substrates is greatly reduced when the metal deposition is restricted to certain areas on the film (i.e., other than complete surface coverage). In the process disclosed in U.S. Ser. No. 155,897, it was believed necessary to uniformly and substantially completely texturize the polyimide surface prior to electrolessly depositing nickel or cobalt on the polyimide surface.

U.S. Pat. No. 4,725,504 filed Feb. 16, 1988, a process is disclosed for forming polyimide film coated on both surfaces with electroless nickel or cobalt and copper coated on the nickel or cobalt which is useful for forming printed circuits. The resulting laminate is capable of passing IPC tests for peel strength and solder float resistance. However, the product is inconsistent in passing modified IPC tests for thermal cycling stability wherein the product is subjected to a plurality of high temperature environments. Such a thermal cycling environment would be experienced by such a laminate product that forms a layer in a multi-layer laminate.

The phrase thermally stable double sided adhesiveless laminate structure used herein refers to a double sided, polyimide based, laminate structure capable of not only passing IPC test methods 2.2.9 (peel strength) and 2.4.13 (solder float resistance) as written but also capable of passing the much more rigorous modifications of these test methods described below.

Both IPC test methods 2.4.9, Peel Strength, Flexible Printed Wiring Materials, and 2.4.13 Solder Float Resistance, Flexible Printed Wiring materials specify that when testing double sided laminates the Copper cladding on the non test side is or may be removed. After removal of the one copper layer and prior to any test inducing thermal shock or rapid high temperature treating test specimens are dried under specified conditions to remove absorbed moisture from the materials. Without these copper removal and drying steps prior to thermal stress both adhesive based and adhesiveless based laminates, prior to that described in U.S. Ser. No. 155,897 are prone to blistering and/or catastrophic adhesive loss during thermal shock or prolonged high temperature heating.

A test to investigate the effects of prolonged high temperature heating designed to test the thermal durability of an adhesiveless laminate structure under multilayer laminating conditions typically used in the flexible circuit industry is described below and is referenced herein as Modified Thermal Cycling IPC Test Method 2.4.9 Method E or F.

The sample of the double sided adhesiveless laminate to be tested is placed in a cold laminating press between two sheets of Kraft paper, and held flat with two steel platens also referred to as caul plates in the industry. The platens are pressurized to 350 PSI, the temperature is raised to 350° F. and once the high temperature is attained, the sample is held at that temperature and pressure for one hour. The sample is then allowed to cool to room temperature, the pressure is released and the cycle is repeated twice more. Once the sample has passed through this sequence of steps it is then tested for peel strength adhesion as in IPC Test 2.4.9 Method A. Adhesion values of at least 2.5 lbs./inch are confirmation of a useful laminate material.

The test is designed to imitate actual laminating conditions anticipated during circuit manufacture. Removal of the metal cladding and subsequent polyimide conditioning prior to testing is not allowed. This test will be referred to herein as Modified Thermal Cycling IPC Test 2.4.9, Method E or F.

Experience has shown this test, Modified Thermal Cycling IPC Test 2.4.9, Method E or F, to be much more demanding and revealing than any of the following tests:

IPC 2.4.9 Method C
IPC 2.4.9 Method D
IPC 2.4.9 Method E
IPC 2.4.9 Method F
IPC 2.4.13 Revision D when samples are tested via these procedures either as written or using a modified procedure where removal of one copper layer and subsequent polyimide conditioning is not allowed.

It would be desirable to provide a process for coating at least one surface of a polyimide film with electrolessly deposited metal, followed by electrolessly deposited copper having sufficient adherent strength to the polyimide and sufficient resistance to thermal shock to render the resultant laminate useful for fabricating electronic circuits and which process does not require a polyimide surface texturing step.

SUMMARY OF THE INVENTION

The present invention is directed to a process whereby a polyimide sheet or continuous web of polyimide film is uniformly coated on one or both surfaces with a strongly adherent electroless nickel or cobalt layer followed by an electrolytic copper layer. The polyimide film coated with nickel or cobalt with or without a thin copper coating on the nickel or cobalt coating is mechanically worked to form microcracks and hence inducing porosity in the initial thin metal coating. The mechanically worked laminate then is heated to volatilize any volatilizable components, such as moisture in the laminate. The resultant laminate then is coated with electrolytic copper on both surfaces.

Adherent layers of exposed copper are uniformly plated on one or both sides of the sheet and metal layers of controlled thickness are produced which provide laminates useful for the production of electronic circuitry. These laminate structures are suitable of general use in the production of electronic circuitry. The terms "web", "sheet" and "film" are used herein interchangeably and refer to thin flat, flexible polymer substrates. In accordance with this invention, it has been found that by utilizing the microcracking and heating steps it is possible to produce high quality laminates without the need for a polyimide texturizing step as referred to in the application Ser. No. 155,897 referenced above.

In accordance with this invention, as a first step, the polyimide surface is contacted with an aqueous composition which renders the polyimide surface hydrophillic and facilitates absorption of a catalyst for effecting electroless nickel or cobalt deposition. The polyimide surface is then contacted with such a catalyst, e.g., colloidal palladium in order to provide a catalytic surface for the deposition of electroless nickel or cobalt. As used herein, the term "nickel" as it relates to the initial metal layer, includes nickel metal or a nickel containing alloy such as nickel/phosphorous, nickel/boron, etc. Also as used herein, the term "cobalt", as it relates to the initial metal layer includes cobalt metal or a cobalt containing alloy.

In accordance with this invention, the polyimide sheet coated with nickel or cobalt on both surfaces is mechanically worked to form microcracks in the nickel or cobalt. The mechanical working can be effected either prior to or subsequent to coating the nickel or cobalt surfaces with a thin layer (less than about 1.2 um) of copper within which microcracks also can be formed. The mechanically worked and microcracked nickel or cobalt coated laminate then is heated to volatilize the volatilizable components of the polyimide film core, such as water. As a final layer, electrolytic copper is applied to the laminate on both surfaces to the desired thickness. Because they have a nickel or cobalt initial metal layer these laminates exhibit outstanding performance similar to that described in the related U.S. Pat. No. 4,725,504 when tested according to IPC test procedures 2.4.9 (March 1986 update) and 2.4.13 (June 1986 update). Because they have the nickel or cobalt initial layer and have been thermally stabilized by the method described herein and in U.S. Ser. No. 155,897, they also perform well under modified IPC 2.4.9 and 2.4.13 procedures where removal of one copper layer and subsequent polyimide conditioning is not allowed. They also perform well under the stringent Modified Thermal Cycling IPC Test 2.4.9 Method E or F described above.

Prior to this present invention, no double-sided adhesiveless laminate, apart from adhesiveless laminates disclosed in U.S. Ser. No. 155,897 were capable of passing this more stringent test.

DESCRIPTION OF THE SPECIFIC EMBODIMENTS

Figure 1:
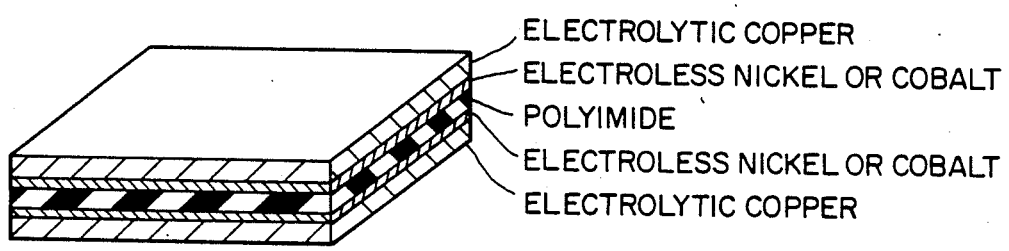
FIG. 1 shows the embodiment of this invention where polyimide film is coated on both sides with nickel or cobalt and copper.
Figure 2:
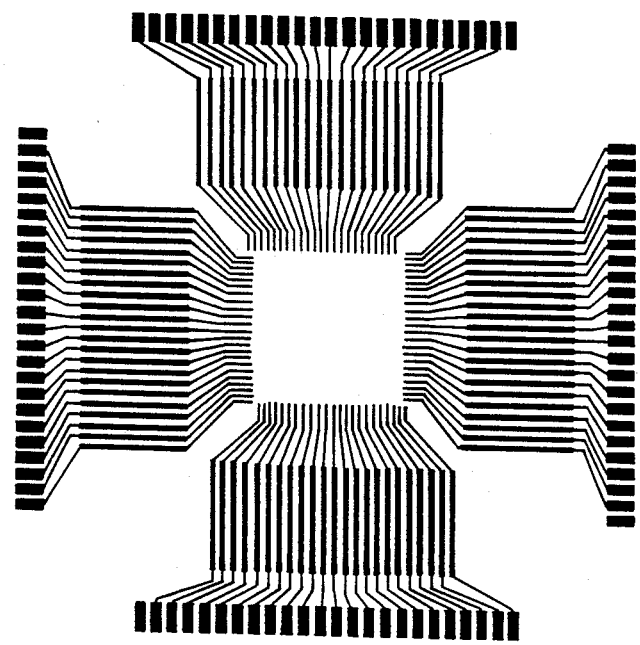
FIG. 2 shows a typical circuit used in Tape Automated Bonding (TAB) producible using a laminate of this invention.

In the preferred embodiment of this invention, the polyimide surfaces treated are of the type prepared from a polyamide-acid (also referred to as polyamic acid) which has the formula:

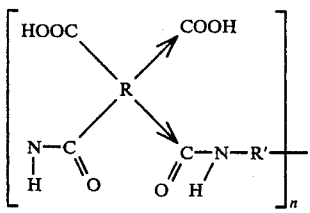

where the arrows denote isomerism, R is an organic tetravalent radical containing at least two carbon atoms, no more than two carbonyl groups of each polyamic acid unit being attached to any one carbon atom of said tetravalent radical; R' is a divalent radical containing at least two carbon atoms, the amide groups of adjacent polyamide-acid units attached to separate carbon atoms of divalent radical and n is a positive integer sufficient to provide the polyamic acid with an inherent viscosity of at least 0.1. The most preferred of such polyimides is Kapton (Trademark registered to DuPont) and Apical (Trademark of Allied-Signal co.) which are the polyimides formed from pyromellitic anhydride,

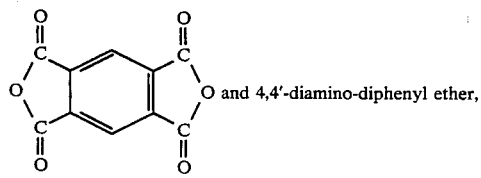

having the general formula:

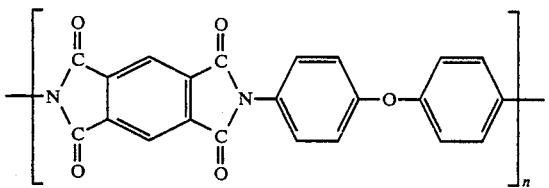

where n is an integer ranging from 150 to 650 and which has an average molecular weight of 60,000 to 250,000. The above polyimides and their preparation are described in U.S. Pat. Nos. 3,179,614 and 3,179,634 to Edwards, which are incorporated herein by reference. Other examples of suitable polyimides are the Upilex polyimides available from ICI America, Inc. Upilex S polyimide is formed from the anhydride of the formula:

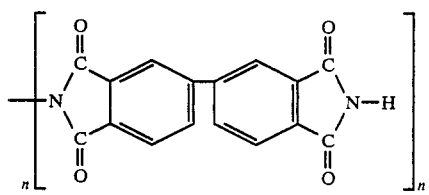

and a diamine.

The polyimide can have any thickness suitable as a substrate for electronic circuitry, and most generally is in the form of a relatively thin sheet having a thickness of between about 12 and 125 um. Other than that disclosed in U.S. Ser. No. 155,897 a polyimide film coated on both sides with a permanently bonded metal comprising electroless nickel or cobalt followed by electrolytic copper capable of surviving modified IPC tests 2.4.9 and 2.4.13, where removal of one copper layer and subsequent polyimide conditioning are not allowed as well as the "Modified Thermal Cycling IPC Test 2.4.9, Method E or F" described below has not been available. Tests for thermal cycling are designed to test the thermal durability of the laminate product of this invention under the conditions of alternating (a) high temperature and pressure and (b) room temperature. The modification of IPC test 2.4.9 Method E described herein is intended to simulate conditions that would be experienced by the laminate material during the manufacture of a typical multilayer circuit product, wherein the laminate of this invention would make up one or more of the multiple circuit layers. The actual test used is as follows:

A sample of the laminate to be tested is placed in a cold laminating press between two sheets of Kraft paper, and held flat with two steel platens also referred to as caul plates in the industry. The platens are pressurized to 350 PSI, the temperature is raised to 350° F. and once the high temperature is attained, the sample is held at that temperature and pressure for one hour. The sample is then allowed to cool to room temperature, the pressure is released and the cycle is repeated twice more. Once the sample has passed through this sequence of steps it is then tested for peel strength adhesion as in IPC Test 2.4.9 Method A. Adhesion values greater than approximately 3 lbs./inch are confirmation of a useful laminate material.

The test is designed to imitate actual laminating conditions anticipated during circuit manufacture. The removal of the metal cladding and subsequent polyimide conditioning prior to testing is not allowed. This test will be referred to in the specification and claims as "Modified Thermal Cycling IPC Test 2.4.9, Method E or F".

Two basic techniques for preparing electronic circuits which involve removal of unwanted metal are briefly outlined below.

| Semi-Additive Process | Subtractive Process |
|---|---|
| Thin Laminate (e.g., 0.5–8 um metal) | Thick Laminate (e.g., 35 um metal) |
| Apply resist | Apply resist |
| Photoimage | Photoimage |
| Develop resist | Develop resist |
| Electrolytic copper plate (e.g., 35 um) | Etch unmasked metal |
| Strip resist | Strip resist |

| -continued | |
|---|---|
| Semi-Additive Process | Subtractive Process |
| | Etch to remove thin laminate metals in non-circuit areas |

No modification of existing procedures for the production of said circuitry is necessary using laminates of this invention. A further advantage for the use of the method of this invention is that metal thicknesses can be provided easily from extremely thin to very thick layers. Laminates with layers of metal less than about 18 um (½ ounce) are difficult to produce using present adhesive laminate production methods with metal foils, but are easily produced in a continuous roll-to-roll plating process by the method of this invention.

The polyimide film surface should be relatively clean, but a cleaning or degreasing step may be performed (if necessary) prior to contact with the hydrophilizing composition and catalyst for effecting electroless metal deposition.

Suitable hydrophilizing compositions are those which improve the water wettability of the polyimide surface and which are commonly available in the art including potassium hydroxide, a sodium hydroxide or any caustic composition which can be used alone or with a lower alkanol such as methanol or ethanol, chromic acid or the like or texturizing compositions which do not adversely affect the mechanical properties of the polyimide surfaces. It is believed that the mechanism for improving water wettability of the polyimide surfaces involves ring opening of the polyimide molecular structure.

Once the clean polyimide surface has been rendered hydrophillic the film is catalyzed with any one of the catalyst systems well known to those versed in the art of electroless plating. Catalyst combinations which can be used in conjunction with the sensitized polyimide surface are disclosed in U.S. Pat. Nos. 3,011,920 and 3,562,038 which are incorporated herein by reference. The catalyst may be applied in a two step application, by first depositing the sensitizer and then the noble metal activator; however, these baths may be combined in a one step operation, e.g., a black colored tin-palladium colloidal dispersion.

The catalyzing is provided for a period of one to five minutes, and then the sample is immersed in an acidic solution to remove tin from the surface in a process referred to as acceleration. The sample is then placed in an electroless nickel or cobalt bath for a period ranging from about two to ten minutes to provide the desired thickness of nickel.

Suitable electroless nickel baths are disclosed in U.S. Pat. Nos. 3,062,666; 3,140,188; 3,338,726; 3,531,301; 3,537,878; and 3,562,038 which are incorporated herein by reference. Some typical formulations are shown:

| 1. Nickel chloride ($NiCl_2.6H_2O$) | 20.0 g/l |
|---|---|
| Sodium hypophosphite ($NAH_2PO_2.H_2O$) | 60.0 g/l |
| Ammonium oxalate (($NH_4$) $C_2O_4.H_2O$) | 40.0 g/l |
| Ammonium Hydroxide 25% | 60. ml/l |
| pH 8.2, 85° C. | |
| 2. Nickel Sulfate ($NiSO_4.6H_2O$) | 20.0 g/l |
| Dimethylamine Borane | 3.0 g/l |
| Citric Acid | 10.0 g/l |
| Conc. HCl | 25.0 ml/l |
| pH 5.2-5.5, 95° C. | |
| Ammonium Hydroxide | to pH 7.0 |

| -continued | |
|---|---|
| 2-mercaptobenzothiazole 65° C. | 0.5-2.0 mg/l |
| 3 Nickel Sulfate ($NiSO_4$; $6H_2O$) | 17.1 g/l |
| Sodium Hypophosphite ($NaH_2PO_2.H_2O$) | 14.0 g/l |
| Acetic Acid 80% | 12.0 g/l |
| $MoO_3$ 85% (adjust to control rate) | 5.0 mg/l |
| pH 5.2-5.5, 95° C. | |
| 4. Nickel Chloride ($NiCl_2.6H_2O$) | 16.0 g/l |
| Dimethylene Borane | 3.0 g/l |
| Sodium Citrate | 18.0 g/l |
| Glycine | 8.0 g/l |
| Bismuth Nitrate | 20.0 mg/l |
| Thiorea | 15.0 mg/l |
| pH 7.0, 65° C. | |

Nickel or cobalt is deposited on the receptive surfaces by electroless deposition to form a metal coated surface. Nickel ions are reduced in this process onto the catalytic surface to form a continuous electrically conductive layer. The electroless layer must be sufficiently thick to permit the subsequent electrolytic deposition of a uniform copper layer. Generally, the electroless nickel or cobalt layer is between about 0.2 um and 1.0 um thick but can be thicker if desired.

The use of nickel rather than copper as an initial metal layer provides several significant advantages. Most importantly, in sharp contrast with the characteristics of the copper/polyimide interface the nickel/polyimide interface is not degraded at high temperature (~176° C., 350° F.). However, it should also be stated that both the copper/polyimide and nickel/polyimide interfaces are degraded at high temperatures (~176° C., 350° F.) if moisture is present at the metal/polyimide interface. Thus the essence of this application is the novel process whereby a double sided, nickel or cobalt based adhesiveless laminate with little or no water in the polyimide core is produced. Prior to U.S. Ser. No. 155,897 no double sided adhesiveless laminates with equivalent thermal stability characteristics were obtainable. Unexpectedly, it has been found that electroless nickel/boron alloys etch more easily than electroless nickel/phosphorous alloys when standard copper etchants such as cupric chloride are used. The nickel/boron alloy producing baths are easier to use with a continuous reel to reel process and are not as prone to catastrophic decomposition as are nickel/phosphorous baths. It is preferred to utilize electroless nickel baths wherein the reducer for the nickel is dimethylamine borane (DMAB), since the resultant nickel coating can be subsequently etched with a common etching solution such as cupric chloride. Copper is not useful as interfacial metal layer since it can catalyze thermal degradation of the polyimide and lead to poor post solder float and thermal cycle peel strength values due to the thermal sensitivity of the copper/polyimide interface.

While the double metal coated laminate product described and claimed in the related U.S. Pat. No. 4,725,504 provides substantial advantages over prior art laminates, it is characterized by inconsistent resistance to thermal cycling or the Modified Thermal Cycling IPC Test 2.4.9 Method E or F. That is, the product tends to develop reduced metal adhesion and thus peel strengths when exposed to repeated conditions of high temperature of the order that would be experienced in the production of the typical multilayer circuit board. For this reason its utility is limited to circuitry where little or no lamination is required, as for example the production of TAB (tape automated bonding) circuits.

A major use of such laminates presently is in multilayer circuits wherein the laminates, in the form of double sided circuits are adhesively bonded to each other under conditions of high temperature and pressure, usually in a stack of three to five laminates or more.

If the laminates experiences reduced peel strengths to below an acceptable minimum peel strength, it cannot be used for multilayer circuits. In accordance with the present invention, it has been found that, after the nickel or cobalt layers have been coated on the polyimide surface, if the resultant laminate is mechanically worked to form microcracks in the metal surface, followed by heating, the product formed after the electrolytic copper of desired thickness is coated on the nickel or cobalt is characterized by excellent resistance to Modified Thermal Cycling IPC Test 2.4.9 Method E or F. The microcracks can be formed into the nickel or cobalt coating either directly or after a thin layer of electrolytic copper has been coated on one or both of the nickel or cobalt layers. The initial flash copper layer has a thickness such that microcracks form therein during the mechanical working. The electrolytic copper layer should be approximately 1.0 um.

Figure 3:
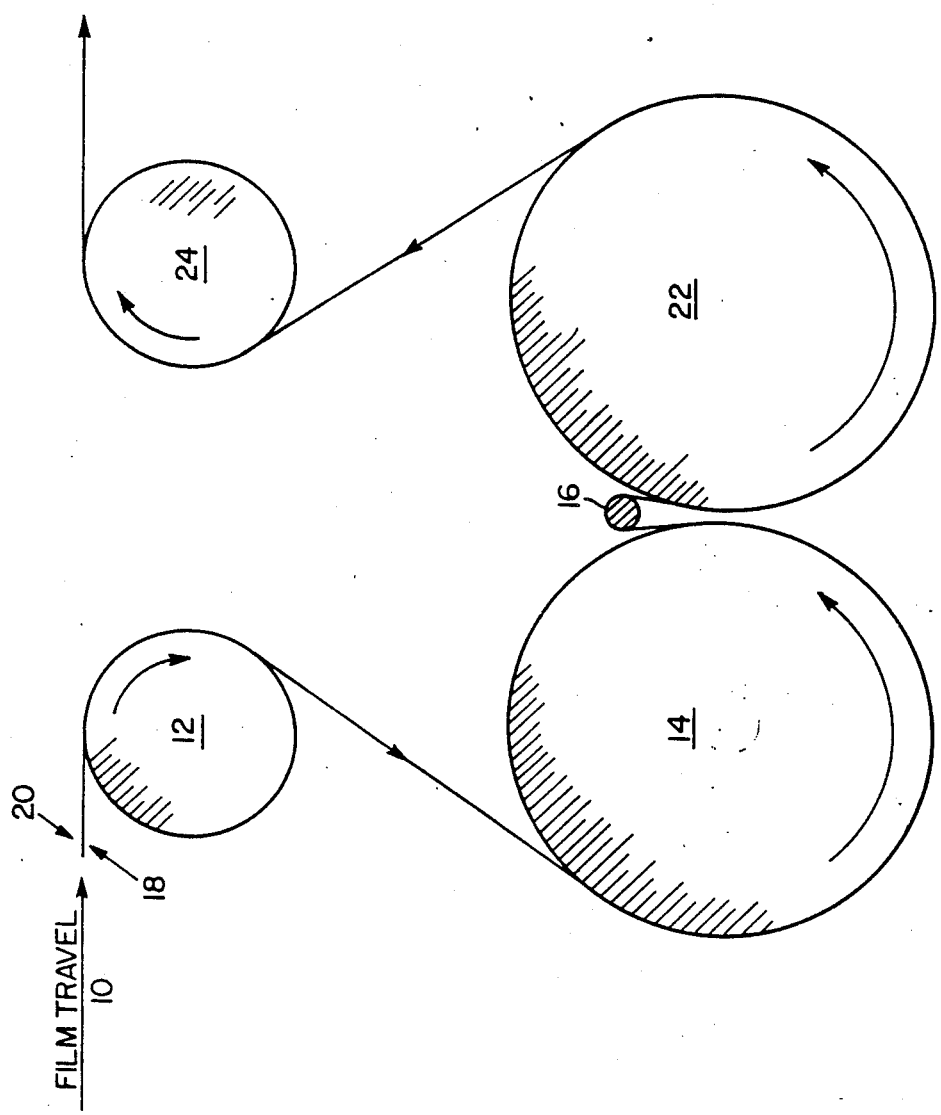
FIG. 3 is a diagram of the cracking apparatus used to produce microcracks in the electroless nickel or electroless nickel and thin electrolytic copper layer as described in the method of this invention.

The mechanical working step can be conducted by a variety of means including passing the laminate in contact over a dull knife edge or any other means where porosity of the initial metal layer(s) is increased without significantly changing the resistive properties of the thin metal layer(s). The preferred method for forming microcracks inducing porosity in the metal layer or layers will be described below in detail with reference to FIG. 3. However, the scope of this invention is not limited by the microcracking technique. Other techniques which serve to increase the porosity of the initial metal layer without significantly changing the resistive properties include the use of shot peening, corrosive chemical fog, and low temperature thermal shock can be utilized.

A web of laminate 10 is passed over idler roller 12, support rollers 14 and 22 and cracking roller 16. Cracking roller 16 has a sufficiently small diameter so that the compression forces on the underside surface 18 of laminate 10 and the tension forces on the topside surface 20 of laminate 10 are sufficient to cause the formation of microcracks in the metal layers of one or both surfaces 18 and 20. The laminate 10 then is passed over idler roller 24. The microcracks run generally parallel to the main axis of roller 16. The laminate having the microcracks therein then is heated to a temperature at which volatizable components such as moisture in the polyimide layer can volatize and escape the laminate through the microcracks. The heating can be conducted in any convenient manner such as by baking in an oven or passing the laminate through a heated inert oil such as silicone, fluorcarbon, or peanut oil. The heating is conducted at a temperature and for a time sufficient to effect substantial removal of the volatilizable materials from the polyimide sheet without degrading the polyimide or metal layers. Generally, heating is effected at a temperature between about 165° C. and 225° C., preferably between about 180° C. and 210° C. for a period of about 5 to 20 minutes. The microcracked and baked film can then be electroplated at a lower temperature without readsorbing deleterious amounts of water into the core polyimide film presumably since the transport rate of water vapor through the cracked nickel film is much higher than that of water from the aqueous process solutions. In order to improve the subsequent electrolytic deposition, the metal surfaces are cleaned to remove or reduce the metal oxides thereon. The passive nickel oxide layer can be removed with an acid cleaner which should not be so strong as to remove the nickel layer itself. Suitable cleaners are aqueous solutions of sulfamic or citric acid. The resultant laminate is then coated with electrolytically deposited copper to the desired thickness.

A serious deficiency of prior double sided adhesiveless laminates is their failure and loss of bond strength when subjected to standard high temperature processing conditions. The method of this invention provides thermally stabilized double sided adhesiveless laminates which provide products that pass solder float adhesion testing by IPC tests 2.4.9 and 2.4.13 as written as well as using a modified procedure where removal of one copper layer and subsequent polyimide conditioning is not allowed. These laminates are also characterized by good performance in Modified Thermal Cycling IPC Test 2.4.9 Method E or F described above. The combination of proper polyimide film pretreatment and electroless bath chemistry and the method of this invention has provided a class of adhesiveless laminates that prior to U.S. Ser. No. 155,897 were unavailable.

In particular, this invention provides a laminate with the following advantages over the prior art:

1. Single or double-sided adhesiveless laminate constructions with excellent adhesion.

2. Initial adhesion values superior to those obtained using electroless copper for both single- and double-sided laminate constructions.

3. Post solder float adhesion greater than that obtained by other methods, with no random failure or blowoff during solder float testing as per IPC Test 2.4.9 or 2.4.13.

4. Excellent resistance to thermal cycling effects encountered during multilayer circuit fabrication.

5. A superior laminate provided consistently with both sheet and roll-to-roll processing of the film.

6. Laminate structures can be provided having a very thin conductive layers produced at significant cost savings, and more reliably than those produced by prior methods.

7. Laminate structures with improved flex ductility when compared to the adhesive-based and adhesiveless laminates presently available.

8. Laminate structures which have improved dimensional stability when compared to adhesive-based laminates.

9. Metal coated laminates processable under conditions normally utilized for production of circuitry when a nickel/boron alloy is used for initial metallization.

10. Elimination of a polyimide texturizing step.

The following examples illustrate the present invention and are not intended to limit the same.

The following examples illustrate that polyimide films of various commercial brands and grades, the surfaces of which have not been rendered substantially and completely textured as described in the related U.S. Ser. No. 155,897, but which are rendered hydrophilic by methods well known to those versed in the art can be utilized to produce laminates, via this invention, having two metal surfaces and good performance in the modified IPC Test 2.4.9 Method E or F described above. The examples also clearly show by comparison the unique circuit manufacturing advantage of laminates produced by the method of this invention.

EXAMPLE I

A 14 inch wide continuous web of type VN 200 Kapton brand polyimide film is treated to render the surface hydrophilic with a solution formed by mixing 18.5 gallons of a 45% KOH aqueous solution and 6.5 gallons of methanol at 22° C. for a dwell time of 45 seconds. The film then was washed extensively with water. The film, as viewed under a microscope, was untextured in that the surface was smooth in appearance. This treated film is further processed on both surfaces with the following sequence.

1. 60 sec. at 25° C. in 23% solution of an aqueous acid bath sold under the tradename, Cataprep 404 available from Shipley Company, Inc.
2. 120 sec. at 45° C. in a 3% concentration of an aqueous colloidal palladium catalyst sold under the tradename, Cataposit 44 available from Shipley Company, Inc.
3. Rinse for 60 sec. in water.
4. 180 sec. at 25° C. in a 10% solution of an acidic accelerator sold under the tradename, Shipley Accelerator 19 available from Shipley Company, Inc.
5. Rinse for 30 sec. in water.
6. 300 sec. at 65° C. in an electroless nickel plating solution, utilizing dimethylamine borane as the reducing agent, sold under the tradename Niklad 753 from the Allied Kelite division of Witco Chemical Corporation. Final nickel thickness approximates 11.24 to 11.74 microinches.
7. A sample of the laminate from step 6 is retained, another is passed through the apparatus of FIG. 3, to effect microcracking of the nickel layer, wherein the diameter of roller 16 is 0.109 inches and the gap between rolls 14 and 22 is 0.009 inches.
8. Bake the microcracked laminate from step 7 in an oven at 196° C. for 13 minutes, 20 seconds.
9. Clean the samples for 30 seconds at 35° C. in a solution containing 3% by weight of sulfamic acid.
10. Electroplate with copper for 90 minutes at 15 amps per square foot (ASF) in a brightened copper sulfate bath containing 25 ounces per gallon of sulfuric acid, 15 ounces per gallon of copper sulfate pentahydrate, 50–70 ppm chloride ion, and 1.0% of an organic brightener sold under the tradename Copperlume PTH-R by M&T Chemicals Co. This provides a laminate coated with about 1 oz./ft.2 of copper.

An Instron Model 1000 Universal Testing Instrument is used to perform adhesion testing as per Modified Thermal Cycling IPC Test 2.4.9 Method F previously described. The average adhesion values are tabulated below.

Modified Thermal Cycling Test 2.4.9 Method F

| | Adhesion Testing (lb/in) | |
|---|---|---|
| | Case 1 Microcrack and Bake | Case 2 No Microcrack No Bake |
| 0 Cycle | 4.8 | 6.1 |
| 1 Cycle | 5.0 | 0 "blow off"* |
| 2 Cycle | 5.2 | 0 "blow off" |
| 3 Cycle | 5.4 | 0 "blow off" |

*The term "blow-off" implies catastrophic delamination or blistering at the metal polyimide interface.

The comparative data and uniform failure modes from Case 1 clearly show the utility of the microcrack and bake process and that the thermal stabilization process is independent of surface texture.

EXAMPLE II

A 14 inch wide continuous web of type VN 100 Kapton brand polyimide film is treated to render the surface hydrophilic and with a solution formed by mixing 18.5 gallons of a 45% KOH aqueous solution and 6.5 gallons of methanol at 22° C. for a dwell time of 45 seconds. The film then was washed extensively with water. The film, as viewed under a microscope, was untextured in that the surface was smooth in appearance. This treated film is further processed as in Example I with the exception of step 7 where:

7. A sample of the laminate from step 6 is retained, another is passed through the apparatus of FIG. 3, to effect microcracking of the nickel layer, wherein the diameter of roller 16 is 0.055 inches and the gap between rolls 14 and 22 is 0.007 inches.

An Instron Model 1000 Universal Testing Instrument is used to perform adhesion testing as per Modified Thermal Cycling IPC Test 2.4.9 Method F previously described. The average adhesion values are tabulated below.

Modified Thermal Cycling Test 2.4.9 Method F
Adhesion Testing (lb/in)

| | Case 1 Microcrack and Bake | Case 2 No Microcrack No Bake |
|---|---|---|
| 0 Cycle | 8.0 | 6.1 |
| 1 Cycle | 7.5 | 0 "blow off"* |
| 2 Cycle | 7.0 | 0 "blow off" |
| 3 Cycle | 7.2 | 0 "blow off" |

*The term "blow-off" implies catastrophic delamination or blistering at the metal polyimide interface.

The comparative data and uniform failure modes from Case 1 clearly show the utility of the microcrack and bake process and that the thermal stabilization process is independent of surface texture and Kapton gauge.

EXAMPLE VII

A 14 inch wide continuous web of type Upilex-S 200 brand polyimide film is treated to render the surface hydrophilic and with a solution formed by mixing 18.5 gallons of a 45% KOH aqueous solution and 6.5 gallons of methanol at 22° C. for a dwell time of 110 seconds. The film then was washed extensively with water. The film, as viewed under a microscope, was untextured in that the surface was smooth in appearance. This treated film is further processed as in Example I with the exception of step 7 where:

7. A sample of the laminate from step 6 is retained, another is passed through the apparatus of FIG. 3, to effect microcracking of the nickel layer, wherein the diameter of roller 16 is 0.103 inches and the gap between rolls 14 and 22 is 0.009 inches.

An Instron Model 1000 Universal Testing Instrument is used to perform adhesion testing as per Modified Thermal Cycling IPC Test 2.4.9 Method F previously described. The average adhesion values are tabulated below.

| Modified Thermal Cycling Test 2.4.9 Method E Adhesion Testing (lb/in) | | |
|---|---|---|
| | Case 1 Microcrack and Bake | Case 2 No Microcrack No Bake |
| 0 Cycle | 3.2 | 3.2 |
| 1 Cycle | 3.0 | 0 "blow off"* |
| 2 Cycle | 2.6 | 0 "blow off" |
| 3 Cycle | 2.9 | 0 "blow off" |

*The term "blow-off" implies catastrophic delamination or blistering at the metal polyimide interface.

The comparative data and uniform failure modes from Case 1 clearly show the utility of the microcrack and bake process and that the thermal stabilization process is independent of surface texture and polyimide type.

We claim:

1. A polyimide laminate sheet product including as one layer of said laminate sheet product a polyimide sheet having two surfaces, each of said polyimide sheet surfaces being free of an adhesive and having a metal coating comprising an electroless nickel or cobalt coating and an electrolytic copper coating bonded to each of said nickel or cobalt coatings, said laminate sheet product being capable of passing the Modified Thermal Cycling IPC Test 2.4.9 Method E or F.

2. The product of claim 1 wherein said electroless coating is a nickel containing alloy.

3. The product of claim 1 wherein said electroless nickel or cobalt coating is at least 0.15 um thick.

4. The product of claim 1 wherein said electroless coating metal coating is a cobalt containing alloy.

5. The product of any one of claims 1, 2, 3 or 4 wherein each of said metal coating is present in a pattern simulating an electronic circuit.

* * * * *